United States Patent
Tunks et al.

(10) Patent No.: US 9,606,585 B2
(45) Date of Patent: Mar. 28, 2017

(54) INTEGRATED POWER SUPPLY HANDLE AND ALTERNATING CURRENT INPUT

(71) Applicant: Dell Products, LP, Round Rock, TX (US)

(72) Inventors: Eric M. Tunks, Austin, TX (US); Carlos G. Henry, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 98 days.

(21) Appl. No.: 14/581,408

(22) Filed: Dec. 23, 2014

(65) Prior Publication Data
US 2016/0179145 A1  Jun. 23, 2016

(51) Int. Cl.
G06F 1/18 (2006.01)
H05K 5/02 (2006.01)
H05K 7/14 (2006.01)

(52) U.S. Cl.
CPC .............. *G06F 1/189* (2013.01); *G06F 1/188* (2013.01); *H05K 5/023* (2013.01); *H05K 7/1492* (2013.01)

(58) Field of Classification Search
CPC .............................. G06F 1/188; H05K 5/0247
See application file for complete search history.

(56) References Cited

U.S. PATENT DOCUMENTS

| | | | | |
|---|---|---|---|---|
| 4,397,088 A * | 8/1983 | Hampel | ................. | A01D 34/90 285/419 |
| 5,286,919 A * | 2/1994 | Benson | ................. | H05K 5/0247 174/101 |
| 5,551,884 A * | 9/1996 | Burkhart, Sr. | ......... | H01R 13/20 439/140 |
| 5,587,881 A * | 12/1996 | Wang | ...................... | G06F 1/184 361/695 |
| 5,949,652 A | 9/1999 | McAnally et al. | | |
| 6,080,004 A * | 6/2000 | Kovacik | ............ | H01R 13/6392 439/352 |
| 6,081,419 A | 6/2000 | Pham | | |
| 6,483,107 B1 | 11/2002 | Rabinovitz et al. | | |
| 6,878,874 B2 * | 4/2005 | Osborn | .............. | H05K 7/20736 174/17 VA |
| 7,382,624 B2 * | 6/2008 | Barsun | ...................... | G06F 1/26 174/50 |
| 7,494,365 B2 | 2/2009 | Gange | | |
| 7,646,590 B1 * | 1/2010 | Corhodzic | ........... | H05K 7/1492 361/622 |
| 7,907,416 B2 * | 3/2011 | He | ........................ | H05K 7/1457 361/748 |

(Continued)

OTHER PUBLICATIONS

U.S. Appl. No. 12/220,928, filed Jul. 30, 2008.

*Primary Examiner* — Adrian S Wilson
(74) *Attorney, Agent, or Firm* — Larson Newman, LLP

(57) ABSTRACT

A power supply unit includes a handle and a power cord. The handle is connected to a panel of the power supply unit via a first leg and a second leg. The handle is configured to provide a location for a user to grip while removing the power supply unit from an information handling system. The power cord includes a first end coupled to the handle, and a second end including a power socket. A first wire of the power cord extends into the power supply unit via the first leg, and a second wire of the power cord extends into the information handling system via the second leg.

20 Claims, 5 Drawing Sheets

(56) References Cited

U.S. PATENT DOCUMENTS

| | | | |
|---|---|---|---|
| 8,614,889 B2* | 12/2013 | Chen | G06F 1/181 |
| | | | 361/679.02 |
| 8,641,443 B1* | 2/2014 | Moussa | H01R 13/6335 |
| | | | 439/484 |
| 2002/0190042 A1 | 12/2002 | Gadamus et al. | |
| 2003/0067224 A1* | 4/2003 | Tai | G06F 1/266 |
| | | | 307/117 |
| 2007/0047180 A1* | 3/2007 | Wirtzberger | H05K 7/1457 |
| | | | 361/600 |
| 2011/0043986 A1* | 2/2011 | Conn | H05K 7/1492 |
| | | | 361/679.02 |
| 2014/0277803 A1* | 9/2014 | Yeh | G06F 1/188 |
| | | | 700/292 |

* cited by examiner

INTEGRATED POWER SUPPLY HANDLE AND ALTERNATING CURRENT INPUT

FIELD OF THE DISCLOSURE

The present disclosure generally relates to an integrated power supply handle and alternating current input.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

Information handling systems utilize power supplies to receive an alternating current (AC) input and to provide power to the remaining portions of the information handling system. A power supply unit may have multiple components along a single panel, such as a cooling fan, exhaust venting, retention features, light emitting diodes, a handle, and the AC input connector.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
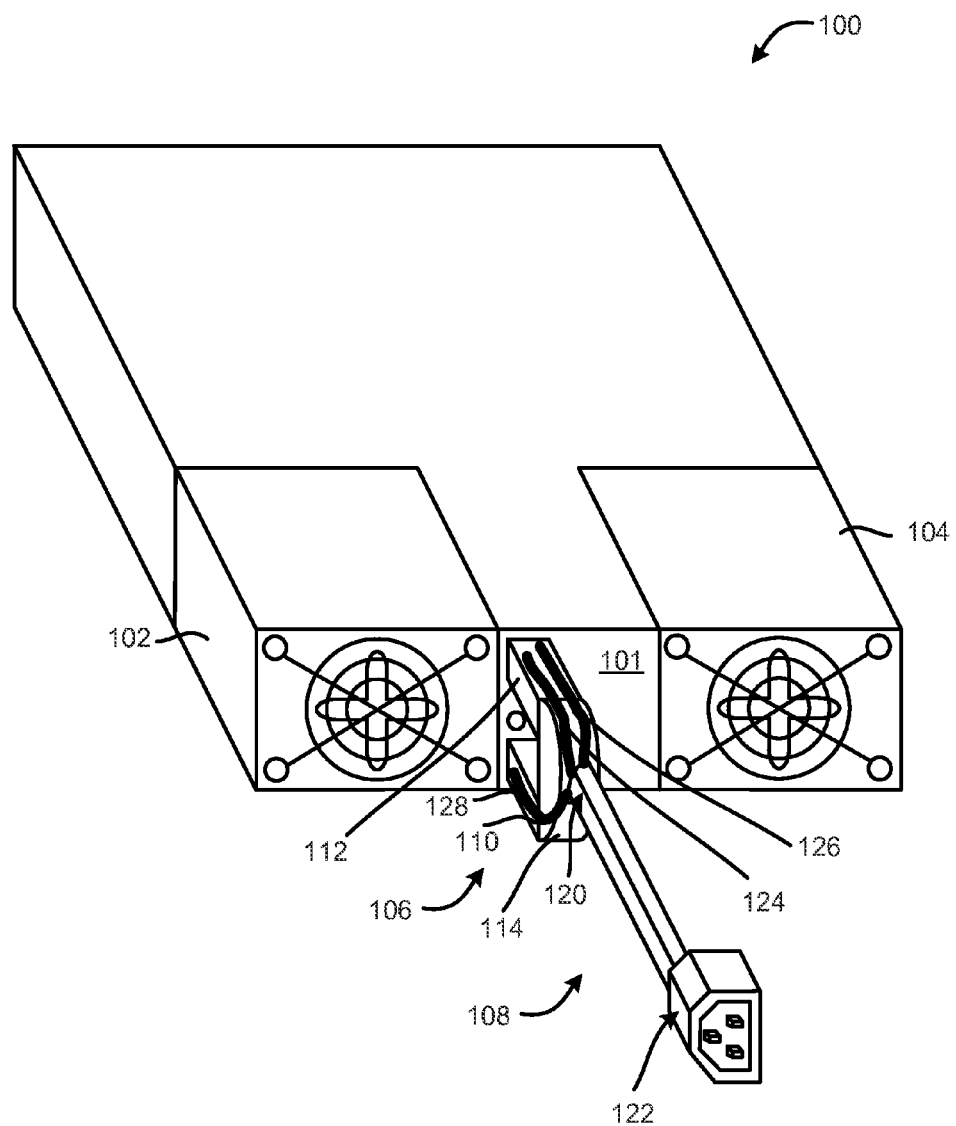
FIGS. 1-4 are diagrams of different embodiments of a power supply.

FIG. 1 shows a power supply unit 100 for an information handling system. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The power supply unit 100 includes a back panel 101, cooling fans 102 and 104, a handle 106, and a power cord 108. The handle 106 includes a first leg 110 and a second leg 112, which in turn are connected together with an end 114. The power cord 108 includes a first end 120, a second end 122 including a power socket, a first wire 124, a second wire 126, and a third wire 128. In an embodiment, the power socket of the second end 122 is a male power socket. In an embodiment, the power cord 108 can be an alternating current (AC) input for the power supply unit 100, and the wires 124, 126, and 128 can be the positive, neutral, and ground wires for the AC input.

The fans 102 and 104 can extend from the back panel 101 into the power supply unit 100. The first and second legs 110 and 112 of the handle can be in physical communication with the back panel 101, and can be securely attached to the back panel. In an embodiment, the end 114 is securely mounted on the ends of the first and second legs 110 and 112 opposite of the back panel 101. In an embodiment, the handle 106 can be utilized by an individual when the individual is removing the power supply unit 100 from an information handling system. For example, the individual can place his or her fingers in between the legs 110 and 112 and can grip the end 114 of the handle 106. The individual can then pull on the end 114 to remove the power supply unit 100 from the information handling system. The handle 106 is mounted securely to the back panel 101, such that the handle does not detach from the back panel in response to the force being applied to the handle by the individual.

The first end 120 of the power cord 108 is in physical communication with the end 114 of the handle 106, and the power cord and handle are securely mounted together at the intersection of the end of the handle and the first end of the power cord. The legs 110 and 112, and the end 114 of the handle are hollow, and the wires 124, 126, and 128 extend from the first end 120 of the power cord 108 through the end and legs of the handle, and then into the power supply unit 100. In an embodiment, the wires 124, 126, and 128 can be coupled to a power distribution board within the power supply unit 100. In an embodiment, two of the wires, such as wires 124 and 126, extend through leg 112 of the handle 106, and one of the wires, such as wire 128, extends through leg 110 of the handle. In another embodiment, all of the wires 124, 126, and 128 may extend through one of the legs 110 or 112. Thus, the handle 106 and power cord 108 combine to firm a single component to provide an AC input to the power supply unit 100 and to provide an individual with handle for removing the power supply unit from the information handling system.

In an embodiment, the combination of the handle 106 and the power cord 108 provides additional space on the back panel 101 as compared to the handle and AC input being separate components in the back panel. Therefore, the power supply unit 100 has enough space along the back panel 101 to include both fans 102 and 104 on the back panel based on the handle 106 and the power cord 108 being combined to provide AC input to the power supply unit. If the handle 106 was not combined with the power cord 108 to provide AC input, there may not be enough space in the back panel 101 for both fans 102 and 104, such that only one fan would be in the back panel and the cooling capabilities of the power supply unit 100 would be reduced.

Figure 2:
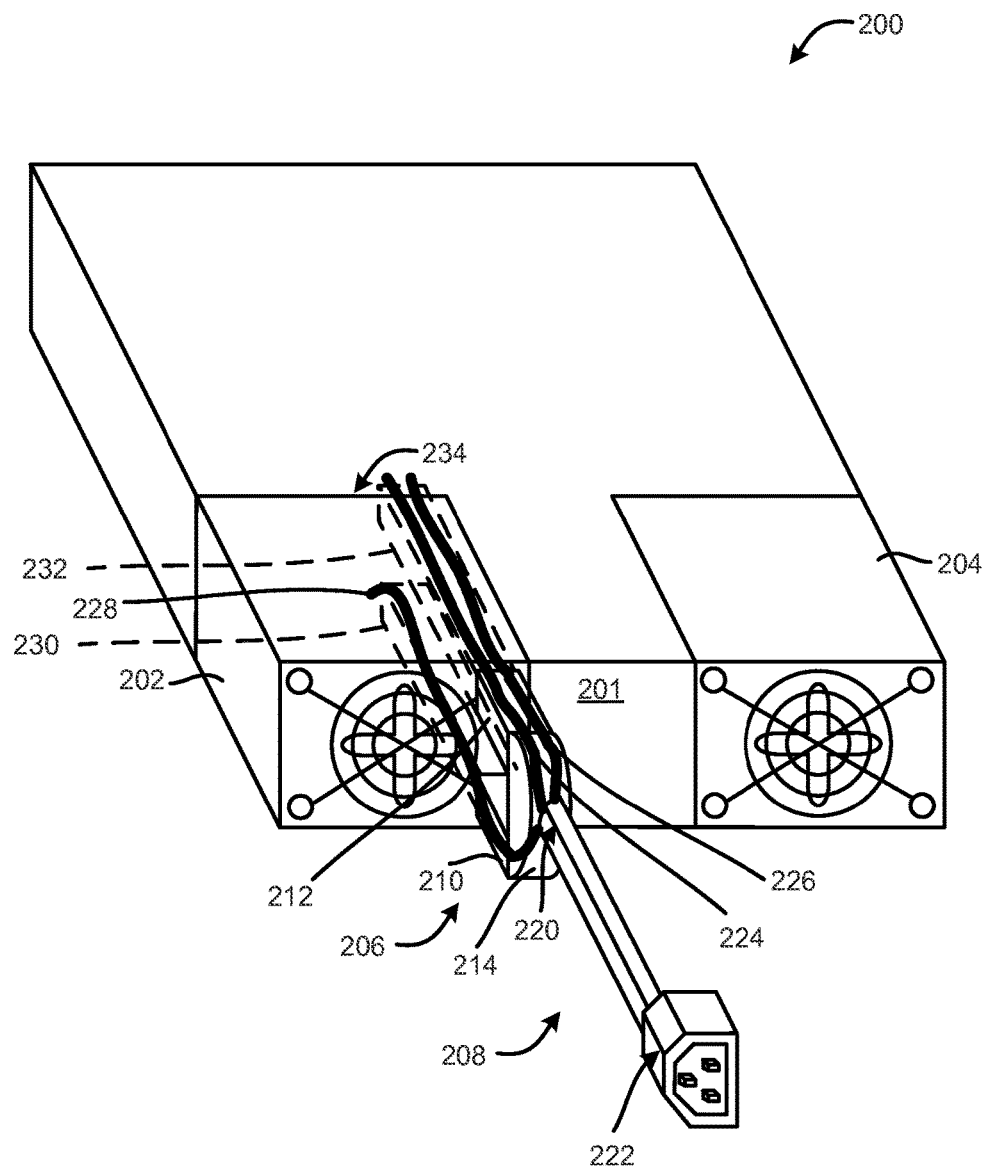

FIG. 2 shows another embodiment of a power supply unit 200 including a back panel 201, cooling fans 202 and 204, a handle 206, and a power cord 208. The handle 206 includes a first leg 210 and a second leg 212, which in turn are connected together with an end 214. The handle 206 also includes a first hollow push pin 230 that extends from an end of the first leg 210, and a second hollow push pin 232 that extends from an end of the second leg 212. The power cord 208 includes a first end 220, a second end 222 including a power socket, a first wire 224, a second wire 226, and a third wire 228. In an embodiment, the power socket of the second end 222 is a male power socket. In an embodiment, the power socket of the second end 222 and the wires 224, 226, and 228 provide an AC input to the power supply unit 200.

The fans 202 and 204 can extend from the back panel 201 into the power supply unit 200. The first and second legs 210 and 212 of the handle can be in physical communication with a housing of the fan 202. In an embodiment, the hollow push pins 230 and 232 can extend through the housing of the fan 202 and lock within an internal panel 234 of the power supply unit 200. When the hollow push pins 230 and 232 lock within the internal panel 234, the hollow push pins can pull the legs 210 and 212 toward the housing of the fan 202. The pulling of the legs 210 and 212 can exert a force on the fan 202, such that the fan is securely held within the power supply unit 100. In an embodiment, the end 214 is securely mounted on the ends of the first and second legs 210 and 212 opposite of the back panel 201. In an embodiment, the handle 206 can be utilized by an individual when the individual is removing the power supply unit 200 from an information handling system. For example, the individual can place his or her fingers in between the legs 210 and 212 and can grip the end 214 of the handle 206. The individual can then pull on the end 214 to remove the power supply unit 200 from the information handling system. The hollow push pins 230 and 232 are preferably locked within the internal panel 234 with a force that is greater than the force required to remove the power supply unit 100 from the information handling system, such that the handle does not detach from the fan 202 or the power supply unit in response to the force being applied to the handle by the individual.

The first end 220 of the power cord 208 is in physical communication with the end 214 of the handle 206, and the power cord and handle are securely mounted together at the intersection of the end of the handle and the first end of the power cord. The legs 210 and 212, and the end 214 of the handle are hollow, and the wires 224, 226, and 228 extend from the first end 220 of the power cord 208 through the end, legs, and hollow push pins 230 and 232 of the handle, and then into the power supply unit 200. In an embodiment, the wires 224, 226, and 228 can be coupled to a power distribution board within the power supply unit 200. In an embodiment, two of the wires, such as wires 224 and 226, extend through leg 212 and the hollow push pin 232 of the handle 206, and one of the wires, such as wire 228, extends through leg 210 and hollow push pin 230 of the handle. In another embodiment, all of the wires 224, 226, and 228 may extend through one of the legs 210 or 212 and its corresponding hollow push pin 230 or 232. Thus, the handle 206 and power cord 208 combine to form a single component to provide an AC input to the power supply unit 200 and to provide an individual with handle for removing the power supply unit from the information handling system.

In an embodiment, the combination of the handle 206 and the power cord 208 provides additional space on the back panel 201 as compared to the handle and AC input being separate components in the back panel. Therefore, the power supply unit 200 has enough space along the back panel 201 to include both fans 202 and 204 on the back panel based on the handle 206 and the power cord 208 being combined to provide AC input to the power supply unit. If the handle 206 was not combined with the power cord 208 to provide AC input and fan mounting, there may not be enough space in the back panel 201 for both fans 202 and 204, such that only one fan would be in the back panel and the cooling capabilities of the power supply unit 200 would be reduced.

Figure 3:
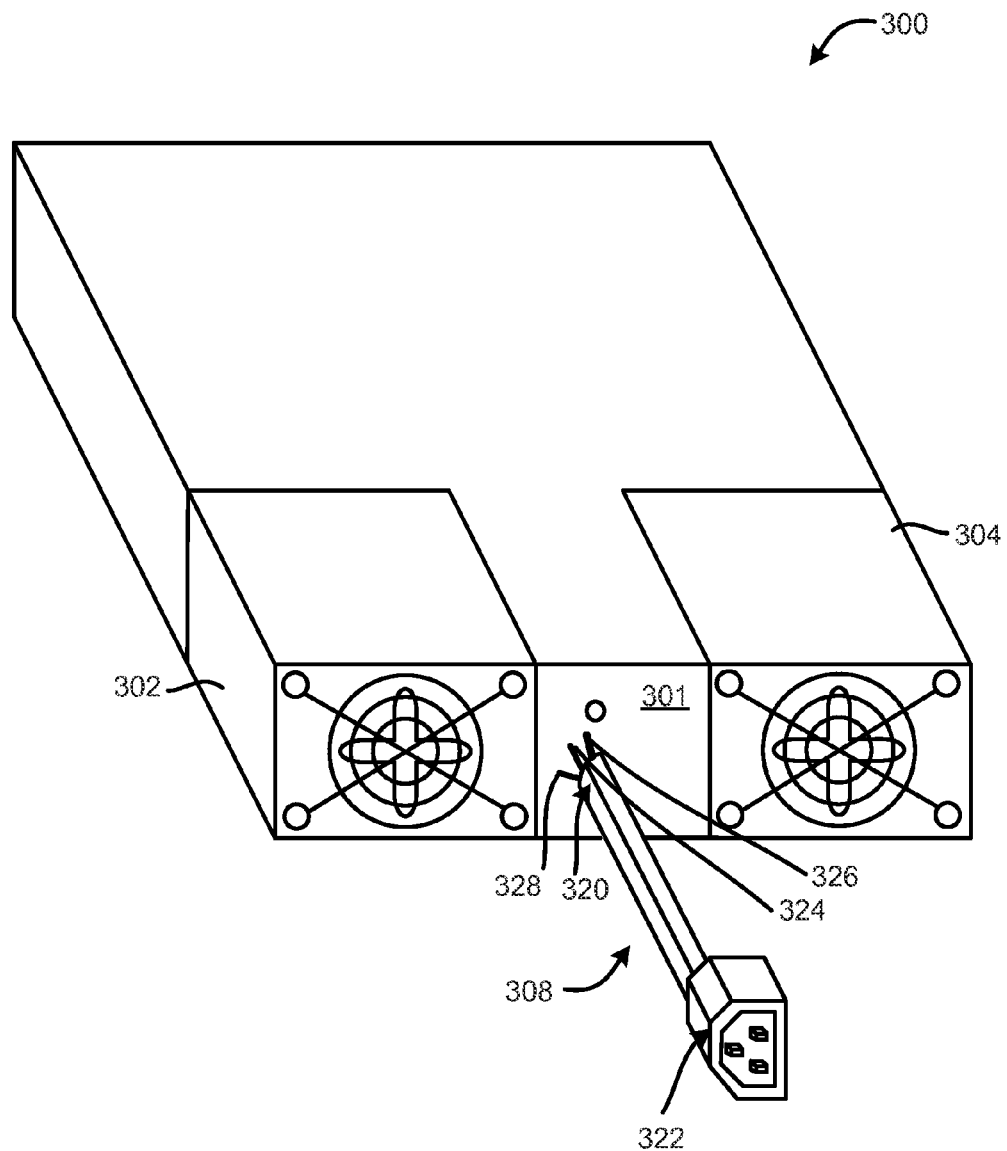

FIG. 3 shows another embodiment of a power supply unit 300 including aback panel 301, cooling fans 302 and 304, and a power cord 308. The power cord 308 includes a first end 320, a second end 322 including a power socket, a first wire 324, a second wire 326, and a third wire 328. In an embodiment, the power socket of the second end 322 is a male power socket. In an embodiment, the power cord 308 can be an alternating current (AC) input for the power supply unit 300, and the wires 324, 326, and 328 can be the positive, neutral, and ground wires for the AC input.

The fans 302 and 304 can extend from the back panel 301 into the power supply unit 300 and can receive power from a power distribution board of the power supply unit coupled to the wires 324, 326, and 328. The first end 320 of the power cord 308 is in physical communication with the back panel 301, and the power cord is securely mounted to the power supply unit 300 at the back panel. The wires 324, 326, and 328 extend from the second end 322 of the power cord 308 through the back panel 301 and into the power supply unit 300. In an embodiment, the wires 324, 326, and 328 can be coupled to the power distribution board within the power supply unit 300. The power cord 308 provides an extension for the AC input to the power supply unit 300.

As illustrated in FIG. 3, the power socket at the second end 322 of the power cable is larger than the first end 320, such that less space in the back panel 301 is occupied by the AC input for the power supply unit 300. Therefore, the power supply unit 300 has enough space along the back panel 301 to include both fans 302 and 304 on the back panel based on the power cord 308 extending from the back panel to provide AC input to the power supply unit. If the power cord 308 did not extend from the back panel 301 to provide AC input, there may not be enough space in the back panel 301 for both fans 302 and 304, such that only one fan would be in the back panel and the cooling capabilities of the power supply unit 300 would be reduced.

Figure 4:
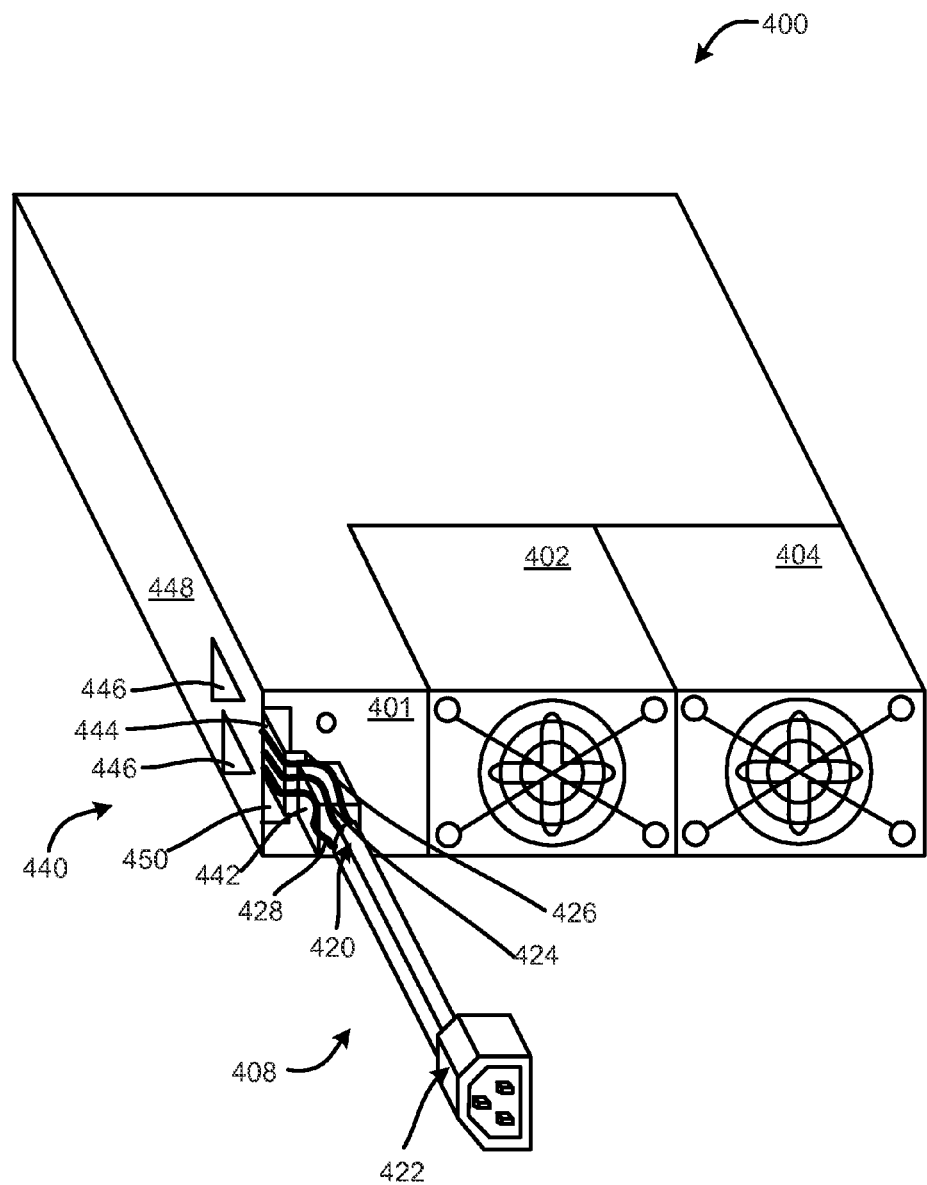

FIG. 4 shows another embodiment of a power supply unit 400 including a back panel 401, cooling fans 402 and 404, a power cord 408, a mechanical retention latch 440, and a side panel 448. The power cord 408 includes a first end 420, a second end 422 including a power socket, a first wire 424, a second wire 426, and a third wire 428. In an embodiment, the power socket of the second end 422 is a male power socket. In an embodiment, the power cord 408 can be an alternating current (AC) input for the power supply unit 400, and the wires 424, 426, and 428 can be the positive, neutral, and ground wires for the AC input. The mechanical retention latch 440 includes a knob 442, a latch portion 444, and hooks 446.

The fans 402 and 404 can extend from the back panel 401 into the power supply unit 400 and can receive power from a power distribution board of the power supply unit coupled to the wires 424, 426, and 428. The latch portion 444 of the mechanical retention latch 440 extends from the knob 442 through a hole 450 in the back panel, and continues along an inside surface of the side panel 448. The hooks 446 of the mechanical retention latch 440 extend from the latch portion 444, and extend through the side panel 448 when the mechanical retention latch is in a locked position.

An individual can exert a force on the knob 442 to make the latch portion 444 flex away from the side panel 448, which in turn can cause the hooks 446 to be removed from the side panel. Thus, as the latch portion 444 of the mechanical retention latch 440 is moved from one side of the hole 450 to the other, such as away from the side panel 448, the mechanical retention latch can be placed in an unlocked position and the power supply unit 400 can be removed from the information handling system.

In the embodiment illustrated in FIG. 4, the first end 420 of the power cord 408 is in physical communication with the knob 442, and the power cord is securely mounted to the mechanical retention latch 440 via the connection of the first end 420 of the power cord and the knob of the mechanical retention latch. The wires 424, 426, and 428 extend from the second end 422 of the power cord 408, through the knob 442 of the mechanical retention latch 440, along the latch portion 444, and into the power supply unit 400 via the hole 450 in the back panel 401. In an embodiment, the wires 424, 426, and 428 can be coupled to the power distribution board within the power supply unit 400.

In an embodiment, the combination of the mechanical retention latch 440 and the power cord 408 provides additional space on the back panel 401 as compared to the mechanical retention latch and AC input being separate components in the back panel. Therefore, the power supply unit 400 has enough space along the back panel 401 to include both fans 402 and 404 on the back panel based on the handle 406 and the power cord 408 being combined to provide AC input to the power supply unit. If the mechanical retention latch 440 was not combined with the power cord 408 to provide AC input, there may not be enough space in the back panel 401 for both fans 402 and 404, such that only one fan would be in the back panel and the cooling capabilities of the power supply unit 400 would be reduced.

Figure 5:
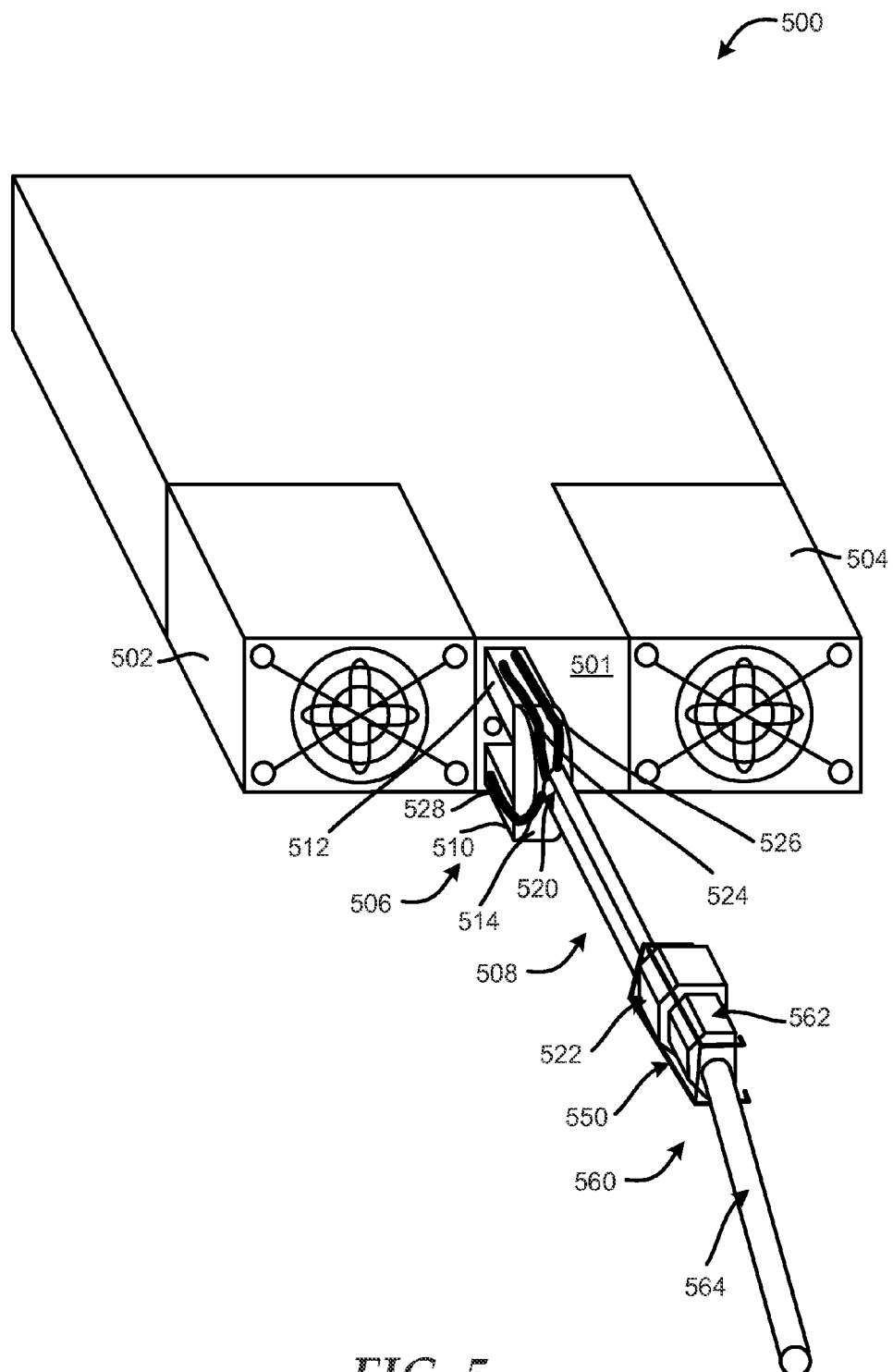
FIG. 5 is a diagram of an embodiment of the power supply unit including a retention mechanism on a power cord of the power supply unit.

FIG. 5 shows another embodiment of a power supply unit 500 including a back panel 501, cooling fans 102 and 504, a handle 506, a power cord 508, and a locking mechanism 550. The handle 506 includes a first leg 510 and a second leg 512, which in turn are connected together with an end 514. The power cord 508 includes a first end 520, a second end 522 including a power socket, a first wire 524, a second wire 526, and a third wire 528. In an embodiment, the power socket of the second end 522 is a male power socket. In an embodiment, the power cord 508 can be an alternating current (AC) input for the power supply unit 500, and the wires 524, 526, and 528 can be the positive, neutral, and ground wires for the AC input.

The fans 502 and 504 can extend from the back panel 501 into the power supply unit 500. The first and second legs 510 and 512 of the handle can be in physical communication with the back panel 501, and can be securely attached to the back panel. In an embodiment, the end 514 is securely mounted on the ends of the first and second legs 510 and 512 opposite of the back panel 501. The first end 520 of the power cord 508 is in physical communication with the end 514 of the handle 506, and the power cord and handle are securely mounted together at the intersection of the end of the handle and the first end of the power cord. In an embodiment, the handle 506 and the power cord 508 can be coupled together and can be utilized in substantially the same manner as described above with respect to the handle 106 and the power cord 108 of power supply unit 100 in FIG. 1.

In an embodiment, the locking mechanism 550 can be connected to the second end 522 of the power cord 508, and can rotate with respect to the power socket of the second end, such that locking mechanism can either rotate down on top of the power socket or rotate up and away from the power socket. In an embodiment, a second power cable 560 can be connected to the second end of the power cord 508. The second power cable 560 includes plug 562 and a cord 564. In an embodiment, the plug 562 can be a female power plug to interface and connect with the power socket of the second end 522 of the power cord 508.

The locking mechanism 550 can be utilized to hold the power socket of the second end 522 together with the plug 562. In an embodiment, after the plug 562 is inserted into the power socket 522, the locking mechanism 550 can be rotated downward and can snap fitted over the back of the plug 562. While the locking mechanism 550 is snap fitted over the power socket 522 and the plug 562, the power cord 508 and the second power cable 560 can be securely held together, such that the second power cable is not accidently removed from the power socket. Thus, the locking mechanism 550 can prevent any unexpected power loss as a result of the power cord 508 being accidently disconnected from the second power cable 560.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power supply unit comprising:
  a handle connected to a panel of the power supply unit via a first leg and a second leg, wherein the handle is configured to provide a location for a user to grip while removing the power supply unit from an information handling system; and
  a power cord including a first end coupled to the handle, and a second end including a power socket, wherein a first wire of the power cord extends into the power supply unit via the first leg, and a second wire of the power cord extends into the information handling system via the second leg.

2. The power supply unit of claim 1, further comprising:
  a first hollow push pin coupled to an end of the first leg of the handle, the first hollow push pin to insert within a first hole of a fan housing; and
  a second hollow push pin coupled to an end of the second leg of the handle, the second hollow push pin to insert within a second hole of the fan housing.

3. The power supply unit of claim 2, wherein the first and second hollow push pins are configured to mount the fan housing to the power supply.

4. The power supply unit of claim 1, wherein the power cord further include a third wire that extends into the information handling system via the first leg.

5. The power supply unit of claim 1, wherein the power socket is a male power socket.

6. The power supply unit of claim 1, further comprising:
  a locking mechanism coupled to the power socket, the locking mechanism including hooks to engage and hold another power cord within the power socket, wherein the locking mechanism rotates from power socket.

7. A power supply unit comprising:
  a back panel; and
  a power cord including:
    a first end coupled to the back panel;
    a second end including a power socket; and
    first and second wires extending between the first end and the second end, wherein the first and second wires extend into the power supply unit via the first end.

8. The power supply unit of claim 7, further comprising:
  a handle connected to the back panel of the power supply unit via a first leg and a second leg, wherein the handle is configured to provide a location for a user to grip while removing the power supply unit from an information handling system, wherein the first end of the power cord is connected to the handle, and the first wire extends into the power supply unit through the first leg, and the second wire extends into the power supply unit through the second leg.

9. The power supply unit of claim 8, further comprising:
  a first hollow push pin coupled to an end of the first leg of the handle, the first hollow push pin to insert within a first hole of a fan housing; and
  a second hollow push pin coupled to an end of the second leg of the handle, the second hollow push pin to insert within a second hole of the fan housing.

10. The power supply unit of claim 9, wherein the first and second hollow push pins are configured to mount the fan housing to the power supply.

11. The power supply unit of claim 7, further comprising:
  a locking mechanism coupled to the power socket, the locking mechanism including hooks to engage and hold another power cord within the power socket, wherein the locking mechanism rotates from power socket.

12. The power supply unit of claim 7, further comprising:
  a mechanical retention latch including a latch that is configured to extend from the power supply unit to lock the power supply unit within the information handling system and to be pulled within the power supply unit to unlock the power supply unit from the information handling system, wherein the wires of the power cord are configured extend along a surface of the mechanical retention latch and to extend within the power supply unit.

13. The power supply unit of claim 8, wherein the power cord further includes a third wire that extends into the information handling system via the first leg.

14. The power supply unit of claim 7, wherein the power socket is a male power socket.

15. A power supply unit comprising:
  first and second fans to provide airflow to the power supply unit, wherein the first and second fans extend within the power supply unit from a panel of the power supply unit;
  a handle connected to the panel of the power supply unit via a first leg and a second leg, wherein the handle is configured to provide a location for a user to grip while removing the power supply unit from an information handling system; and
  a power cord including a first end coupled to the handle, and a second end including a power socket, wherein a first wire of the power cord extends into the power supply unit via the first leg, and a second wire of the power cord extends into the information handling system via the second leg.

16. The power supply unit of claim 15, further comprising:
  a first hollow push pin coupled to an end of the first leg of the handle, the first hollow push pin to insert within a first hole of a fan housing; and
  a second hollow push pin coupled to an end of the second leg of the handle, the second hollow push pin to insert within a second hole of the fan housing.

17. The power supply unit of claim 16, wherein the first and second hollow push pins are configured to mount the fan housing to the power supply.

18. The power supply unit of claim 15, wherein the power cord further include a third wire that extends into the information handling system via the first leg.

19. The power supply unit of claim 15, wherein the power socket is a male power socket.

20. The power supply unit of claim 15, further comprising:
  a locking mechanism coupled to the power socket, the locking mechanism including hooks to engage and hold another power cord within the power socket, wherein the locking mechanism rotates from power socket.

* * * * *